United States Patent
Kojovic

(10) Patent No.: US 9,891,289 B2
(45) Date of Patent: Feb. 13, 2018

(54) POWER TRANSFORMER INRUSH CURRENT DETECTOR

(71) Applicant: Cooper Technologies Company, Houston, TX (US)

(72) Inventor: Ljubomir A. Kojovic, Racine, WI (US)

(73) Assignee: Cooper Technologies Company, Houston, TX (US)

( * ) Notice: Subject to any disclaimer, the term of this patent is extended or adjusted under 35 U.S.C. 154(b) by 119 days.

(21) Appl. No.: 14/727,956

(22) Filed: Jun. 2, 2015

(65) Prior Publication Data
US 2015/0349511 A1 Dec. 3, 2015

Related U.S. Application Data

(60) Provisional application No. 62/006,953, filed on Jun. 3, 2014.

(51) Int. Cl.
| | | |
|---|---|---|
| G01R 31/40 | (2014.01) | |
| G01R 15/18 | (2006.01) | |
| G01R 19/165 | (2006.01) | |
| G01R 19/10 | (2006.01) | |

(Continued)

(52) U.S. Cl.
CPC ........... G01R 31/40 (2013.01); G01R 15/181 (2013.01); G01R 19/10 (2013.01); G01R 19/16504 (2013.01); H02H 3/28 (2013.01); H02H 7/045 (2013.01)

(58) Field of Classification Search
CPC ...... G01R 31/40; G01R 15/181; G01R 19/10; G01R 19/16504; H02H 3/28; H02H 7/045
See application file for complete search history.

(56) References Cited

U.S. PATENT DOCUMENTS

| | | | | |
|---|---|---|---|---|
| 6,563,296 B2 * | 5/2003 | Cooke | ............ | G01R 31/12 324/115 |
| 6,810,069 B2 * | 10/2004 | Kojovic | ............ | H02H 3/28 219/503 |
| 7,738,221 B2 | 6/2010 | Kojovic | | |

(Continued)

FOREIGN PATENT DOCUMENTS

| | | |
|---|---|---|
| WO | 96/22541 | 7/1996 |
| WO | 2014/032915 A1 | 3/2014 |

OTHER PUBLICATIONS

Kojovic et al., "Innovative Differential Protection of Power Transformers Using Low-Energy Current Sensors," IEEE Transactions on Industry Applications, vol. 49, No. 5, Sep./Oct. 2013, pp. 1971-1978.

(Continued)

Primary Examiner — Scott Bauer
(74) Attorney, Agent, or Firm — DiBerardino McGovern IP Group LLC

(57) ABSTRACT

Techniques for detecting an inrush current in a power transformer in are disclosed. For example, the presence of an inrush current on a current path in a power transformer may be determined by receiving a signal from a Rogowski coil positioned on a current path of a power transformer, the signal corresponding to a current flowing in the current path; sampling the received signal to produce samples of the received signal; and analyzing the samples of the received signal relative to at least two criteria to determine whether an inrush current is present. When an inrush current is present, operation of a protective relay is blocked.

14 Claims, 9 Drawing Sheets

(51) Int. Cl.
*H02H 3/28* (2006.01)
*H02H 7/045* (2006.01)

(56) References Cited

U.S. PATENT DOCUMENTS

2004/0004794 A1   1/2004   Kang
2009/0147412 A1   6/2009   Kojovic
2011/0063761 A1   3/2011   Kasztenny

OTHER PUBLICATIONS

International Search Report and Written Opinion, counterpart PCT Application No. PCT/US2015/033694, dated Aug. 28, 2015, 15 pages.

* cited by examiner

POWER TRANSFORMER INRUSH CURRENT DETECTOR

CROSS-REFERENCE TO RELATED APPLICATION

This application claims the benefit of U.S. Provisional Application No. 62/006,953, filed on Jun. 3, 2014 and titled POWER TRANSFORMER INRUSH CURRENT DETECTOR, which is incorporated herein by reference in its entirety.

TECHNICAL FIELD

This disclosure relates to a power transformer inrush current detector.

BACKGROUND

A power transformer is an electrical device that transfers energy between two circuits through electromagnetic induction. The power transformer can step up, or step down, voltage by a numeric value (the transformer ratio). The transformer has a primary side and a secondary side. During ordinary operation, the power is the same on the primary side and the secondary side. Because power is voltage times current, during ordinary operation, the current entering the power transformer on the primary side is the same as the current leaving the power transformer on the secondary side, scaled by the transformer ratio. Differential protection of power transformers compares the current entering the transformer and the current leaving the power transformer. A difference between the current entering and leaving the power transformer may indicate the presence of a fault within the power transformer.

SUMMARY

In one general aspect, a first signal corresponding to a primary current of a power transformer is received from a first Rogowski coil; a second signal corresponding to a secondary current of the power transformer is received from a second Rogowski coil; the first signal is sampled to produce samples of the first signal; the second signal is sampled to produce samples of the second signal; the samples of the first signal and the samples of the second signal are compared to determine samples of a differential signal; whether a pre-determined number of sequential samples of the differential signal is within a first range of values is determined; and whether at least one sample of the differential signal is outside of a second range of values is determined, the values of the first range of values being less than a maximum of the second range of values and greater than a minimum of the second range of values.

Implementations may include one or more of the following features. Whether a second pre-determined number of samples of the differential signal is within a third range of values may be determined, with the third range of values being less than a maximum of the first range of values and greater than a minimum of the first range of values. Determining whether at least one sample of the differential signal is outside of the second range of values may include determining whether at least one sample of the differential signal is greater than the maximum of the second range of values, and determining whether at least one sample of the differential signal is less than the minimum of the second range of values.

When the pre-determined number of sequential samples of the differential signal is within the first range of values and at least one sample of the differential signal is outside of the second range of values, it may be determined that an inrush current is present and the operation of a protective relay may be blocked. When the pre-determined number of sequential samples of the differential signal is within the first range of values and no samples of the differential signal are outside of the second range of values, a fault current may be detected. When fewer than the pre-determined number of sequential samples of the differential signal are within the first range of values a fault current may be detected, and operation of a protective relay may be permitted. Permitting operation of a protective relay may cause a current path to the power transformer to be blocked.

In another general aspect, the presence of an inrush current on a current path in a power transformer is determined by receiving a signal from a Rogowski coil positioned on a current path of a power transformer, the signal corresponding to a current flowing in the current path; sampling the received signal to produce samples of the received signal; and analyzing the samples of the received signal relative to at least two criteria to determine whether an inrush current is present.

Implementations may include one or more of the following features. Analyzing the samples of the received signal relative to at least two criteria may include determining whether a pre-determined number of sequential samples of the received signal is within a first range of values; and determining whether at least one sample of the received signal is outside of a second range of values, the values of the first range of values being less than a maximum of the second range of values and greater than a minimum of the second range of values. When the pre-determined number of sequential samples is within the first range of values, and at least one sample of the received signal is outside of the second range of values, it may be determined that an inrush current is present. The power transformer may be a plurality of single-phase power transformers mutually interconnected to provide multi-phase power.

In another general aspect, a system includes a power transformer and a protection system. The protection system includes a first Rogowski coil positioned to sense a primary current of the power transformer and configured to produce a first signal corresponding to the primary current, a second Rogowski coil positioned sense a secondary current of the power transformer and configured to produce a second signal corresponding to the secondary current; and a controller including one or more electronic processors and a non-transitory computer-readable medium, the non-transitory computer-readable medium including instructions that, when executed, cause the one or more electronic processors to: sample the first signal to produce samples of the first signal, sample the second signal to produce samples of the second signal, determine samples of differential current based on the samples of the first signal and the second signal, access a first range of values, access a second range of values, the first range of values being within the second range of values, determine whether a pre-determined number of sequential samples of the differential current are within the first range of values, determine whether at least one of the samples is greater than a maximum value of the second range of values, and determine whether at least one of the samples is less than a minimum value of the second range of values.

Implementations may include one or more of the following features. The processor may detect an inrush current when the pre-determined number of sequential samples is within the first range of values, at least one of the samples is greater than the maximum of the second range of values, and at least one of the samples is smaller than the minimum of the second range of values. The system also may include a circuit breaker on the current path.

In another general aspect, a first signal corresponding to a primary current of a power transformer is received from a first Rogowski coil; a second signal corresponding to a secondary current of the power transformer is received from a second Rogowski coil; the first signal is sampled to produce samples of the first signal; the second signal is sampled to produce samples of the second signal; comparing the samples of the first signal and the samples of the second signal to determine samples of a differential signal; whether a first condition exists is determined, where the first condition exists when a pre-determined number of sequential samples of the differential signal are within a first range of values, and at least one sample of the differential signal is outside of a second range of values, the values of the first range of values being less than a maximum of the second range of values and greater than a minimum of the second range of values; whether a second condition exists is determined, where the second condition exists when a second pre-determined number of sequential samples of the differential signal are within a third range of values, the third range of values being within the first range of values; and an inrush current is declared if at least one of the first condition and the second condition exists.

Implementations may include one or more of the following features. The pre-determined number of sequential samples and the second pre-determined number of sequential samples may have the same value. The pre-determined number of sequential samples and the second pre-determined number of sequential samples may occur within a single cycle of the sampled differential signal. Operation of a protective relay may be blocked in response to declaring the inrush current.

Implementations of any of the techniques described above may include an apparatus, a system, a protective relay for a power transformer, a controller for a power transformer, instructions stored on a non-transitory computer-readable medium, and/or a method. The details of one or more implementations are set forth in the accompanying drawings and the description below. Other features will be apparent from the description and drawings, and from the claims.

DRAWING DESCRIPTION

Like reference numbers indicate like elements.

DETAILED DESCRIPTION

Techniques for detecting inrush currents of a power transformer are disclosed. An inrush current may occur when a power transformer energizes on one side, causing current to flow in a primary coil (or winding) but not in a secondary coil (or winding). Because the current flowing in the primary coil and the secondary coil are different, the current flowing into the transformer on the primary side may be different than the current flowing out of the transformer on the secondary side. The difference between the current flowing into and out of the transformer may be referred to as a differential current. If the differential current exceeds a threshold (the "differential threshold"), a fault may exist in the power transformer. When the differential current exceeds the differential threshold, a protective relay may operate to protect the transformer and other electrical equipment. For example, the current paths to the power transformer may be blocked (or opened) to protect the power transformer and other equipment.

An inrush current may cause a differential current that exceeds the differential threshold. However, an inrush current is not a fault, and the current paths to the power transformer should not be blocked in the presence of an inrush current. The techniques discussed below allow inrush currents to be detected and distinguished from fault currents. When an inrush current is detected, operation of the protective relay is blocked or prevented for one or more current cycles, thereby reducing or eliminating unnecessary operation of the protective relay. Additionally, the techniques detect inrush currents without reducing the sensitivity of the protective relay.

Prior to discussing the techniques for detecting inrush currents and/or distinguishing inrush currents from faults in detail with respect to FIGS. 4-9, an inrush current detection technique 100 is discussed.

Figure 1:
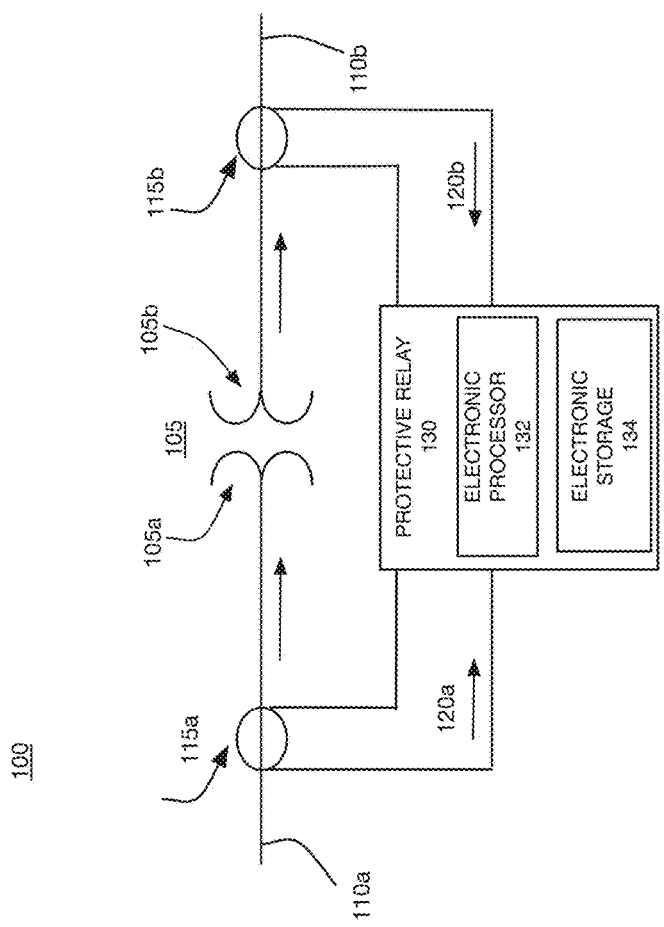
FIG. 1 is a block diagram of an exemplary differential protection system.

Referring to FIG. 1, a block diagram of an exemplary differential protection system 100, which includes a power transformer 105, Rogowski coils 115a, 115b, and a protective relay 130, is shown. The power transformer 105 includes a primary transformer coil 105a and a secondary transformer coil 105b. A primary conductor 110a forms a current path to the primary transformer coil 105a, and a secondary conductor 110b forms a current path to the secondary transformer coil 105b. An alternating current (AC) may flow into or from the primary transformer coils 105a, 105b through the primary and secondary conductors 110a and 110b, respectively.

The Rogowski coil 115a (the primary side Rogowski coil) is positioned to sense current flow in the primary conductor 110a. The Rogowski coil 115b (the secondary side Rogowski coil) is positioned to sense current flow in the secondary conductor 110b. A Rogowski coil can include a coil of wire that is positioned around an electrical conductor in which an AC current flows. The flow of current in the electrical conductor induces a voltage in the Rogowski coil that is proportional to the rate of change of current in the electrical conductor, and the output of the Rogowski coil is proportional to the time rate of change of the current flowing in the electrical conductor. The rate of change of the current may be the first time derivative of the current (di/dt) that flows in the electrical conductor. Further, the output of a Rogowski coil can be connected to an electronic integrator to generate a signal that is proportional to the sensed current.

In this manner, output signals 120a, 120b of the Rogowski coils 115a, 115b are signals that are proportional to current sensed by the Rogowski coils 115a, 115b. The output signals 120a, 120b may be, for example, voltage signals that have values that vary in time, with the values being proportional to a time derivative of the current sensed by the Rogowski coils 115a, 115b.

The portion of the system 100 that is between the Rogowski coils 115a and 115b may be referred to as the protection zone of the differential protection system 100. By comparing the output of the Rogowski coil 115a and the output of the Rogowski coil 115b, a difference between the current flowing into the power transformer 105 at the primary coil 105a and the current flowing out of the power transformer 105 at the secondary coil 105b can be determined.

Figure 2:
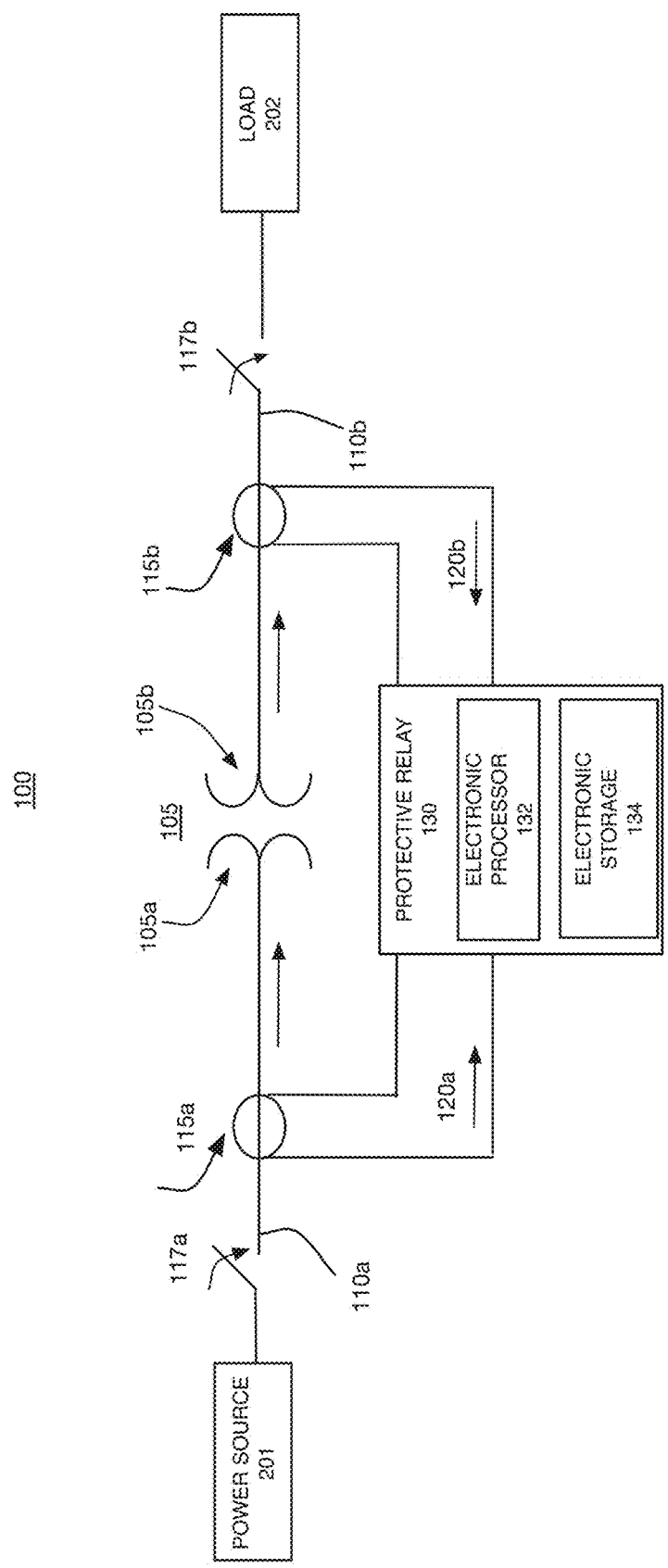
FIG. 2 is another block diagram of the differential protection system of FIG. 1.

Referring also to FIG. 2, which shows the differential protection system 100 connected to a power source 201 and a load 202, the differential protection system 100 also includes a circuit breaker 117a, which opens and closes the primary conductor 110a, and a circuit breaker 117b, which opens and closes the secondary conductor 110b. When the circuit breaker 117a is open, the primary conductor 110a is blocked and current does not flow. Similarly, when the circuit breaker 117b is open, the secondary conductor 110b is blocked and current does not flow.

The differential protection system 100 also includes a protective relay 130, which includes an electronic processor 132 and an electronic storage 134. The electronic storage 134 may be volatile memory, such as RAM. In some implementations, the electronic storage 134 may include both non-volatile and volatile portions or components. The electronic processor 132 may be one or more processors suitable for the execution of a computer program such as a general or special purpose microprocessor, and any one or more processors of any kind of digital computer. Generally, a processor receives instructions and data from a read-only memory or a random access memory or both. The electronic processor 132 may be any type of electronic processor and may be more than one electronic processor.

The electronic storage 134 stores instructions, perhaps as a computer program, that, when executed, cause the electronic processor 132 to communicate with other components in the protective relay 130, the Rogowski coils 115a, 115b, and/or the circuit breakers 117a, 117b. For example, the instructions may be instructions that cause the processor 132 to provide a signal to one or both of the circuit breakers 117a, 117b to open or close. The protective relay 130 receives the output signals 120a, 120b from the respective Rogowski coils 115a, 115b, and provides signals to one or more of the circuit breakers 117a, 117b, which open and close the conductors 110a, 110b in response to a signal from the protective relay 130.

Closing the circuit breaker 117a electrically connects the power source 201 to the primary coil 105a through the primary conductor 110a, energizing the power transformer 105 and causing current to flow in the primary coil 105a but not in the secondary coil 105b. The current that flows to the primary coil 105a in this situation is an inrush current. The inrush current may increase to several times rated current at the time that the transformer is energized and can last for tens of seconds. The inrush current is a transient that decays over time and becomes minimal (for example, 0.5-1% of rated current) in the transformer 105.

When the circuit breaker 117a is closed to connect the power source 201 to the primary coil 105a, the Rogowski coil 115a senses the inrush current that flows in the primary conductor 110a and produces the output signal 120a. The output signal 120a is proportional to the time derivative of the sensed inrush current. The Rogowski coil 115b does not sense a current in the secondary conductor 110b, because no current is flowing, and the output signal 120b may be near zero. Thus, a comparison of the output signals 120a and 120b may produce a differential signal that exceeds the differential threshold even though a fault does not exist.

Figure 3:
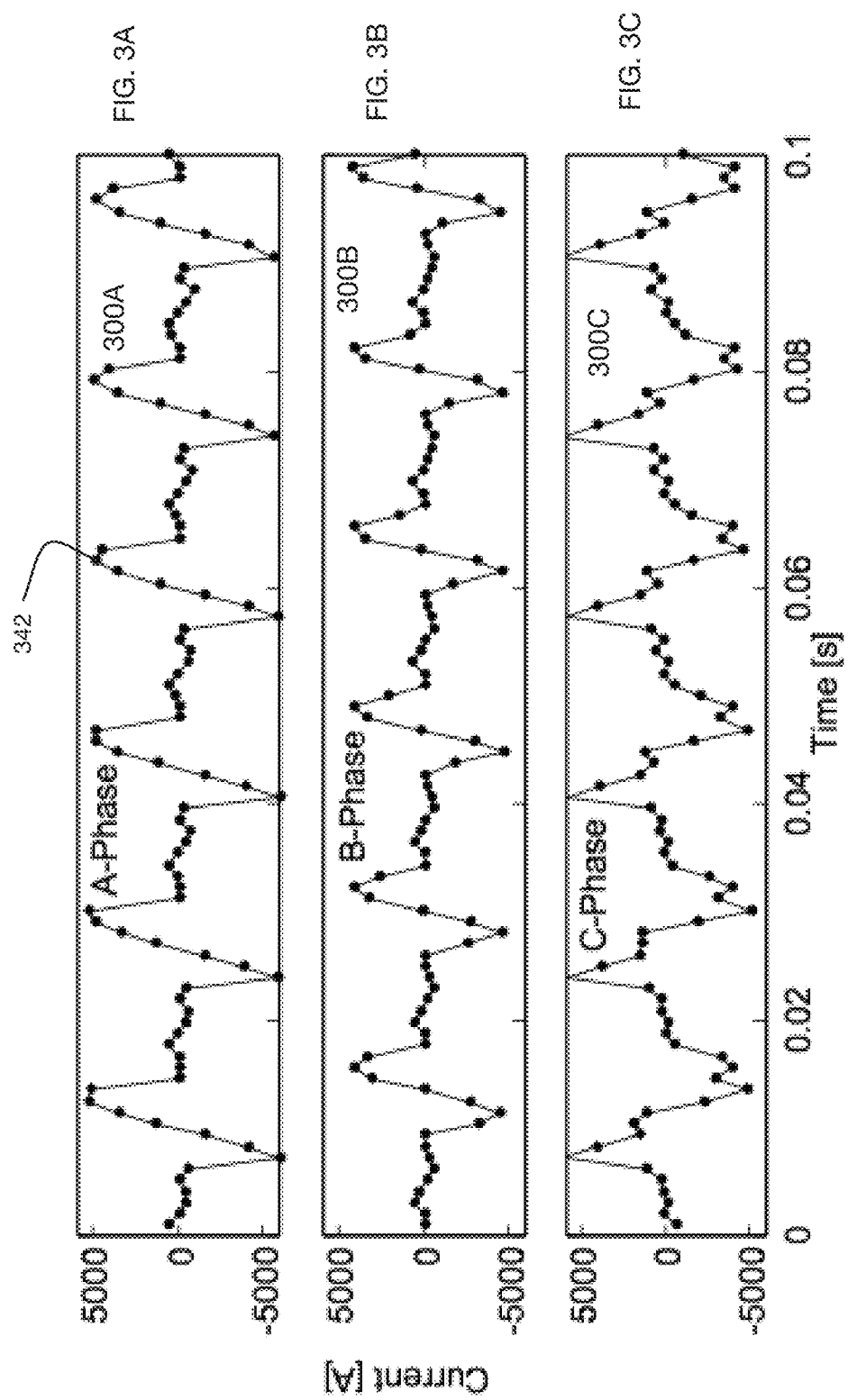
FIGS. 3A-3C are exemplary plots of sensed current as a function of time.

Referring to FIGS. 3A-3C, plots 300A-300C are shown. Each of the plots 300A-300C shows multiple cycles of an exemplary measured output signal of a Rogowski coil that senses an inrush current. The plots 300A-300C show the output (di/dt) of the Rogowski coil corresponding to amperes (A) as a function of time. The points 342 along the plots 300A-300C are discrete time samples, or snapshots, of the Rogowski coil output at a particular time. For simplicity, only one sample 342 is labeled. The examples of FIGS. 3A-3C were produced from Rogowski coils that measured the first time derivative (di/dt) of current flow in a power transformer that includes three single-phase power transformers mutually interconnected to provide three-phase power.

FIG. 3A shows the inrush current measured on a first phase (phase A), FIG. 3B shows the inrush current measured on a second phase (phase B), and FIG. 3C shows the inrush current measured on a third phase (phase C). As discussed below, the shape of inrush current allows the inrush current to be distinguished from a fault current. For example, the inrush currents have sets of samples that are close to zero and form relatively flat regions in the output signal of the Rogowski coil. This shape characteristic may be used to detect the presence of an inrush current.

Figure 4:
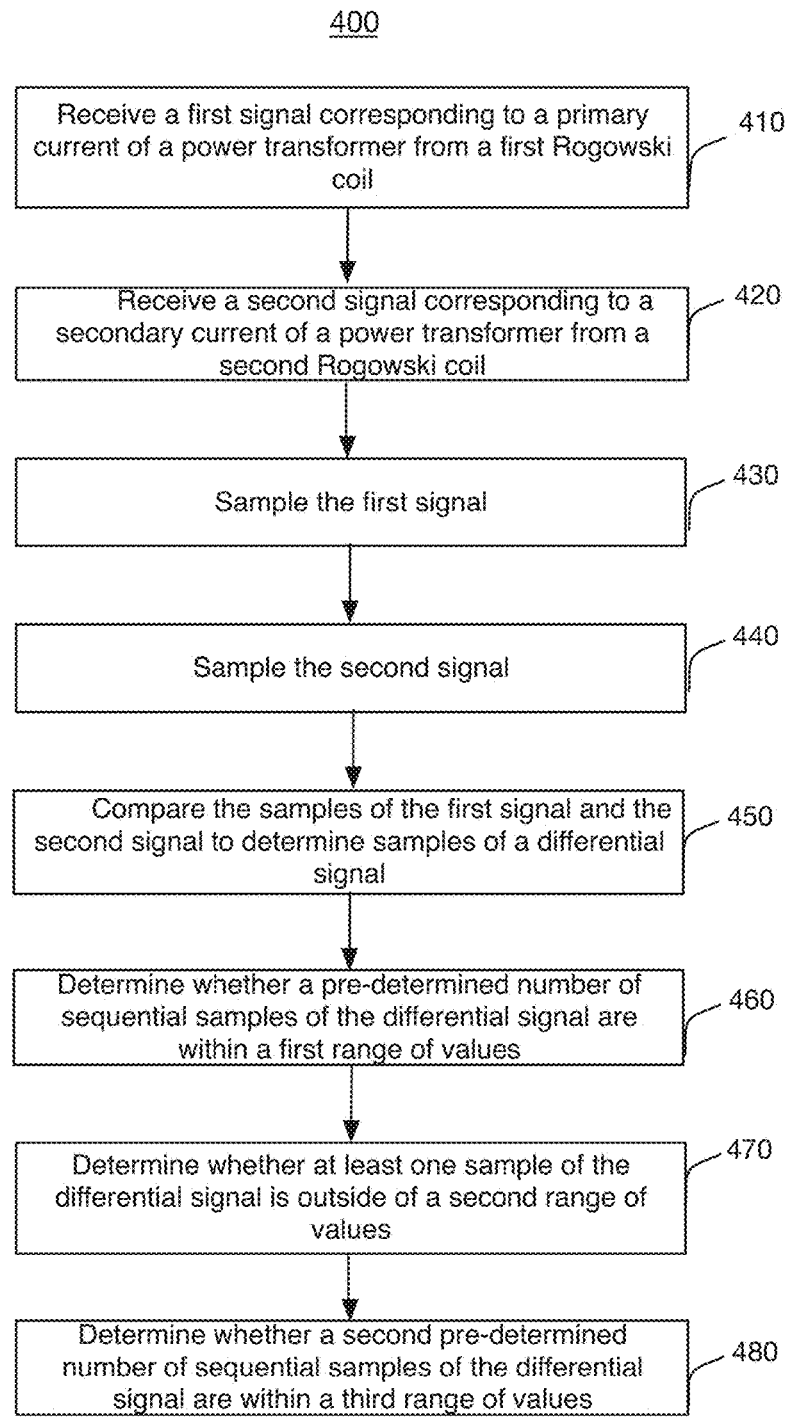
FIG. 4 is a flow chart of an exemplary process for detecting inrush currents in a power transformer.

Referring to FIG. 4, a flow chart of an exemplary process 400 for detecting inrush currents in a power transformer is shown. The process 400 may be performed by the electronic processor 132 of the protective relay 130 (FIGS. 1 and 2). The process 400 is discussed with respect to the differential protection system 100 (FIGS. 1 and 2). However, the process 400 may be performed on any differential protection system that uses Rogowski coils to sense an AC current that flows to and/or from a power transformer.

A first signal corresponding to a primary current of the power transformer 105 is received (410). The first signal may be the output signal 120a that is generated by the primary Rogowski coil 115a. The output signal 120a is proportional to the current flowing through the primary conductor 110a that is sensed by the primary Rogowski coil 115a. A second signal corresponding to a secondary current of the power transformer is received (420). The second signal may be the output signal 120b that is generated by the secondary Rogowski coil 115b. The output signal 120b is proportional to the current flowing through the secondary conductor 110b that is sensed by the secondary Rogowski coil 115b.

The output signals 120a, 120b may be voltage signals that have a magnitude that is proportional to the time rate of change of the current sensed by the Rogowski coils 115a, 115b. Thus, the received first signal may be proportional to the rate of change of current flowing in the primary conductor 110a, and the received second signal may be proportional to the rate of change of current flowing in the secondary conductor 110b.

The first signal is sampled (430), and the second signal is sampled (440). The sampling produces a discrete time representation of each of the first and second signals. The first and second signals are sampled at a sample rate. Sampling the signals provides a snapshot or value of the first and second signals at a regular temporal interval determined by the sampling rate. The sampling rate may be, for example, 16, 64, or 256 samples per cycle, or any other sampling rate that allows the first and second signals to be accurately represented by the samples. The first and second signals are sampled at the same rate, and samples of each of the first and second signals are obtained at the same time.

As discussed above, the first signal can be the output signal 120*a*, and the second signal can be the output signal 120*b*. For an implementation in which the sampling rate is 16 samples per cycle, 16 samples of each of the output signals 120*a*, 120*b* are obtained in per cycle. Each obtained samples is associated with a value and a time. The value of each sample is proportional to the di/dt measured by the Rogowski coil 115*a* or 115*b* at the time the sample was obtained. The samples of the output signals 120*a* and 120*b* are obtained simultaneously. Thus, each sample of the output signal 120*a* has a corresponding sample of the output signal 120*b* that is obtained at the same time.

The samples of the first signal and the samples of the second signal are compared to determine samples of a differential signal (450). The comparison may be, for example, a subtraction of the values of two samples. Continuing the example above, the value of a sample of the output signal 120*a* obtained at a particular time may be compared to the value of a sample of the output signal 120*b* obtained at that same time. A similar comparison is performed for each sample of the sampled output signals 120*a* and 120*b* to obtain samples of a differential signal. Each sample of the differential signal is proportional to the difference between the di/dt values measured by the Rogowski coils 115*a*, 115*b* at a particular time. The sampled differential signal may be referred to as a sampled differential di/dt.

Under ordinary operating conditions, the output scaled signals 120*a*, 120*b* from the Rogowski coils 115*a*, 115*b* are almost the same and all of the samples of the derived differential signal have a near zero value (for example, a value of less than 1% of rated current). When a fault current is present in the power transformer 105, the output signals 120*a*, 120*b* are not the same, causing high-value samples of the differential signal (for example, a sample having a value that is 10 times greater than the rated current or more). Thus, the presence of high-value samples of the differential signal may indicate the presence of a fault that would warrant blocking current flow to the power transformer 105. However, an inrush current also may cause the output signals 120*a*, 120*b* to be different and also may cause high-value samples of the differential signal. Because an inrush current is energizing the transformer 105 and is not a fault, it is not necessary or desirable to block current flow to the transformer 105. Thus, detection of inrush currents may prevent unnecessary blocking of current flow to the transformer 105.

The process 400 analyzes the sampled differential signal to detect inrush currents. A single cycle of the sampled differential signal may be analyzed. Each cycle of the sampled differential signal may be analyzed, or only some cycles of the sampled differential signal may be analyzed. Additionally, the analysis may be performed real-time, or in near real-time, for example, on a cycle-by-cycle basis, with the results of the analysis of one cycle obtained prior to the beginning of the subsequent cycle.

Figure 5:
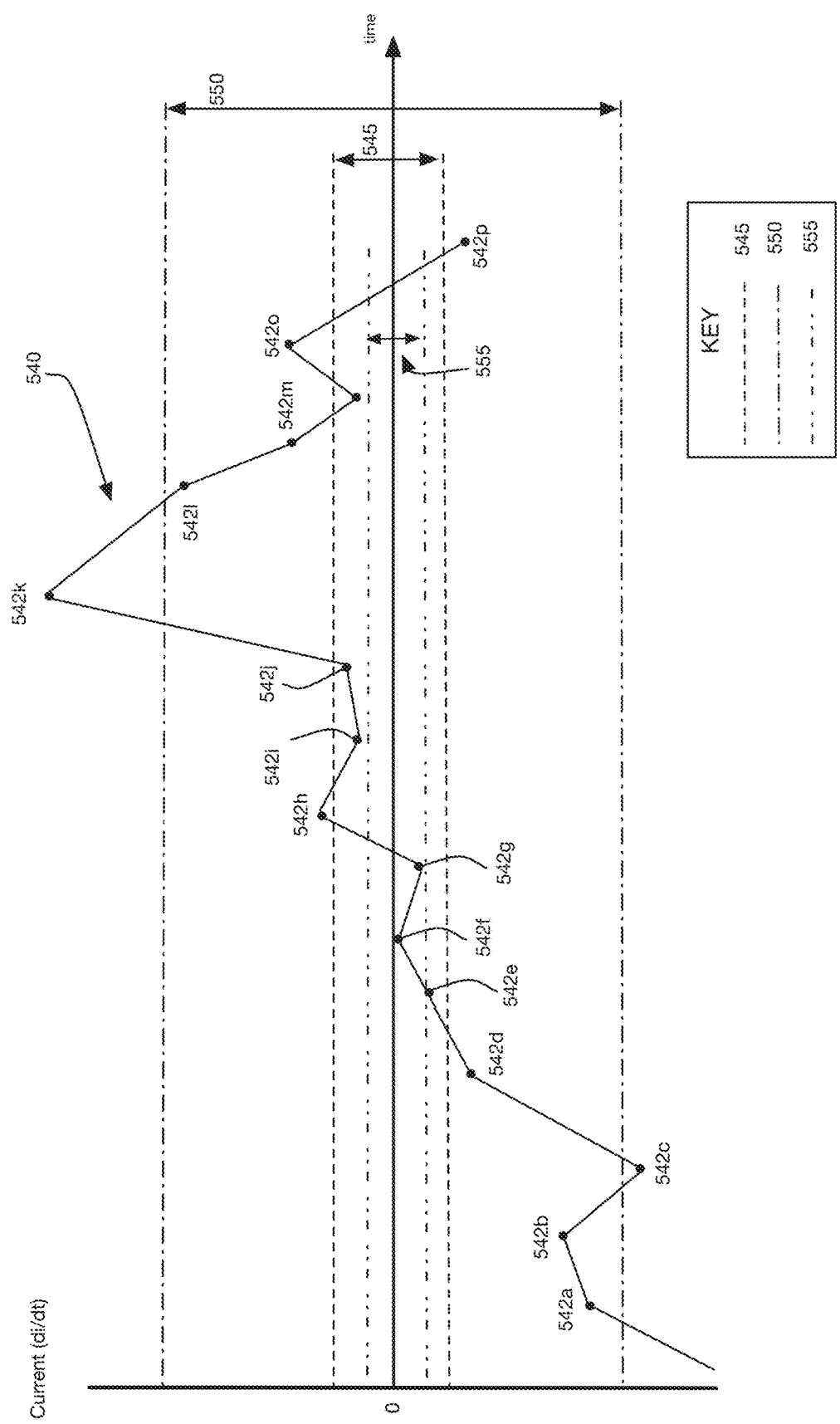
FIG. 5 is a plot of an exemplary sampled differential signal.

FIG. 5 shows a single cycle of an exemplary sampled differential signal 540 obtained from an inrush condition and three numeric ranges against which the samples of the sampled differential signal may be compared. These ranges are a first range of values 545 (also referred to as IRD-2), a second range of values 550 (also referred to as a supervision range), and a third range of values 555 (also referred to as IRD-1). Each of the first, second, and third ranges of values is a range of numeric values of current (di/dt) with a center value of zero. The first range of values 545 is within the supervision range 550. In other words, the minimum value of the first range of values 545 is greater than the minimum value of the supervision range 550, and the maximum value of the first range of values 545 is less than the maximum value of the supervision range 550. The third range of values 555 is within both the first range of values 545 and the supervision range 550.

Comparing the sampled differential signal 540 to more than one range of values allows inrush currents to be distinguished from faults and also allows low current faults to be detected without reducing relay sensitivity. Additionally, the overlap between the first range 545 and the third range 555 helps to ensure that low magnitude inrush currents are detected. A low magnitude inrush current may be an inrush current that has a value of 30% transformer rated currents.

Referring again to FIG. 4, at (460), it is determined whether a pre-determined number of sequential samples in a cycle of the sampled differential signal 540 are within the first range of values 545. In this example, the pre-determined number of sequential samples is three. The example sampled differential signal 540 is sampled at a rate of 16 samples per cycle. Thus, for one cycle, the sampled differential signal 540 includes 16 samples 542*a-p*, each representing a value of the differential signal 540 at a particular time. The differential signal 540 is analyzed and found to include three sequential samples 542*e*, 542*f*, and 542*g* within the first range of values 545. Thus, the pre-determined number of sequential samples (three) is within the first range of values 545. When the pre-determined number of sequential samples is within the first range of values 545, as in this example, the first range of values 545 is "asserted."

Referring again to FIG. 4, at (470), it is determined whether at least one sample is outside of the supervision range 550. A sample is outside of the range 550 when the sample has a value that is greater than the greatest value in the range 550 or less than the minimum value in the range 550. In the example of FIG. 5, the sample 542*k* and the sample 542*c* are outside of the supervision range 550. Because the sample 542*k* (or the sample 542*c*) is outside of the supervision range 550, at least one sample has a value that is outside of the supervision range 550.

The presence of the pre-determined number of sequential samples in the first range of values 545 and at least one sample outside of supervision range 550 indicates that the sampled differential signal 540 is derived from an inrush current. The presence of an inrush current is detected. As a result of determining that an inrush current is present, the operation of the relay 130 is prevented and current flow on the primary conductor 110*a* is not blocked. In other words, even if the root-mean-square (RMS) value of the differential current exceeds the differential threshold (the threshold above which the protective relay 130 may cause blocking of current to and from the transformer 105), the operation of the protective relay 130 is blocked.

Referring again to FIG. 4, (480), in some implementations, a determination of whether a second pre-determined number of sequential samples of the differential signal 540 are within the third range of values 555 is made (480). The second pre-determined number of sequential samples may be the same, higher, or fewer than the pre-determined number of sequential samples within the first range of values 545. Continuing the example above, where the pre-determined number of sequential samples in the first range of values 545 is three, the second pre-determined number of sequential samples in the third range of values 555 may be, for example, four. When the second pre-determined number of sequential samples is within the third range of values 555, the third range of values may be considered "asserted."

Figure 8:
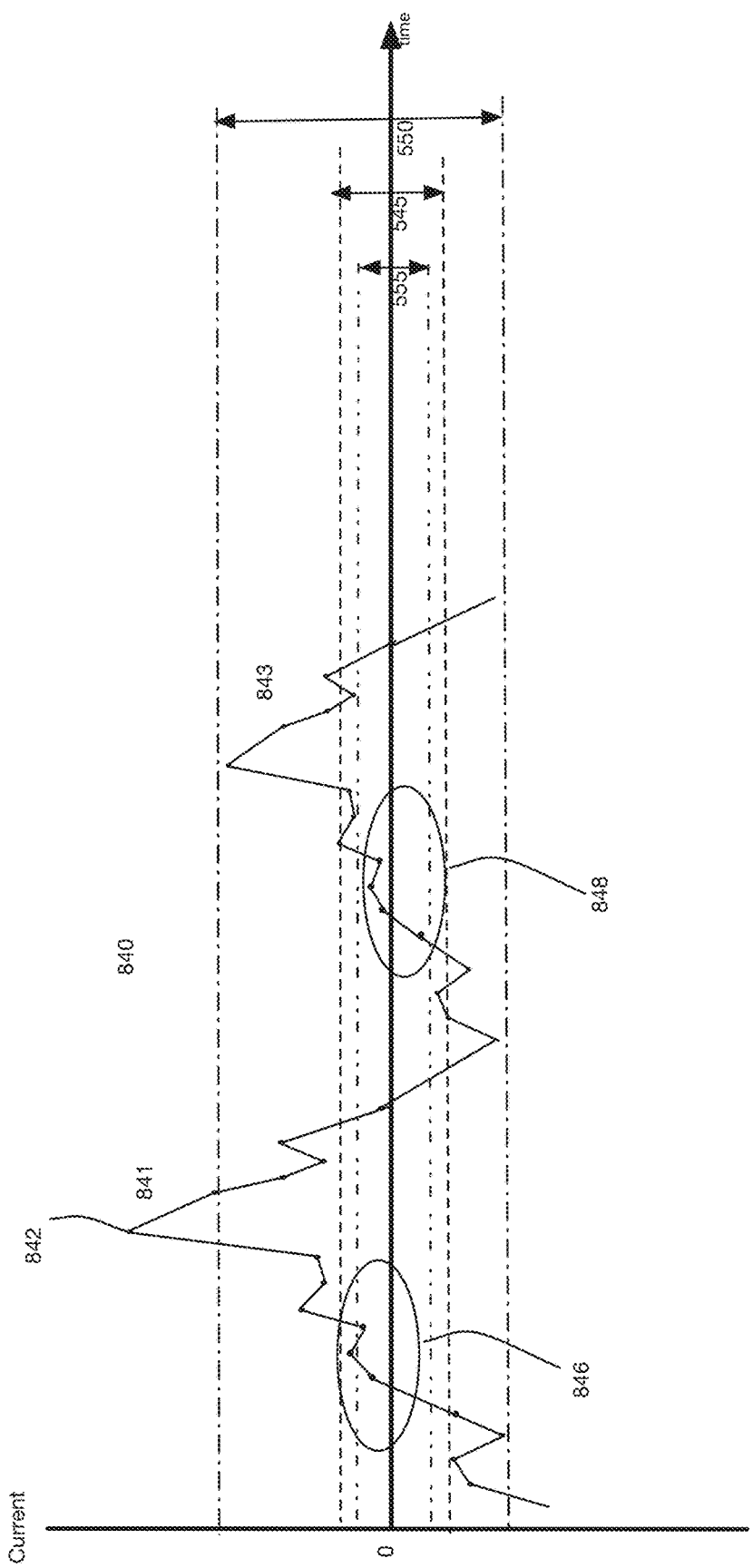
FIG. 8 is a plot of two cycles of an exemplary sampled differential signal.
Figure 9:
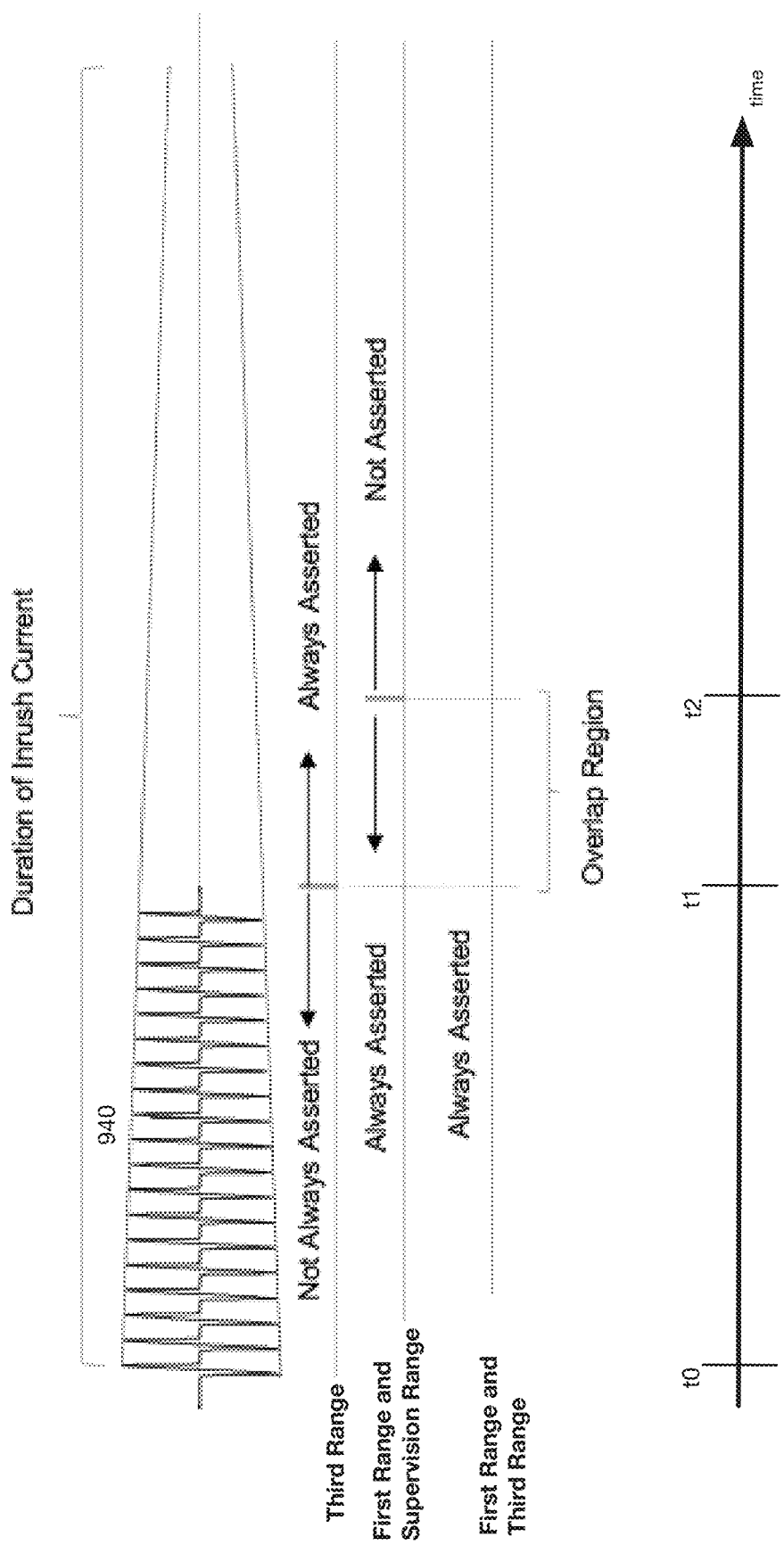
FIG. 9 is a plot of cycles of an exemplary sampled differential signal.

As discussed in greater detail with respect to FIGS. 8 and 9, comparing the sampled differential signal 540 to the first range of values 545 and the third range of values 555 may help to ensure that an inrush current is accurately detected, even when the magnitude of the inrush current decreases over time. In particular, the third range of values 555 is effective to detect inrush currents that occur, for example, more than several seconds after the transformer energizes. Thus, the third range of values 555 may be used to detect inrush currents that occur later in time relative to the energizing of the transformer 105.

The elements of the process 400 may be performed in any order and all of the elements of the process 400 do not have to be performed. For example, in some implementations, if it is determined in (460) that the pre-determined number of samples of the sampled differential signal is not in the first range of values 545, it is determined that an inrush current is not present and the process 400 does not perform (470) to determine whether any samples of the differential signal are outside of the supervision range 550.

Figure 6:
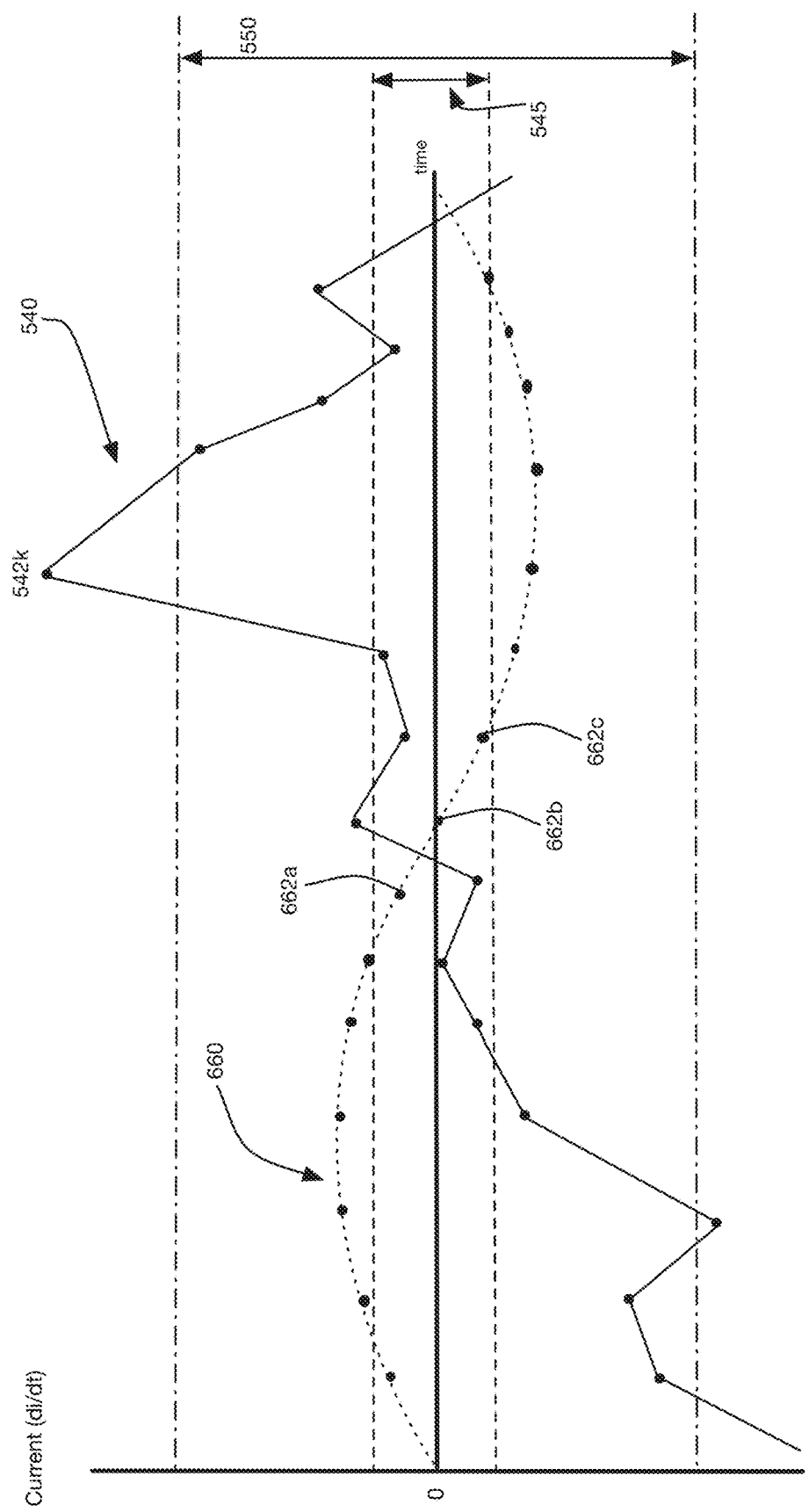
FIGS. 6 and 7 are plots of exemplary fault currents superimposed on a sampled differential signal.
Figure 7:
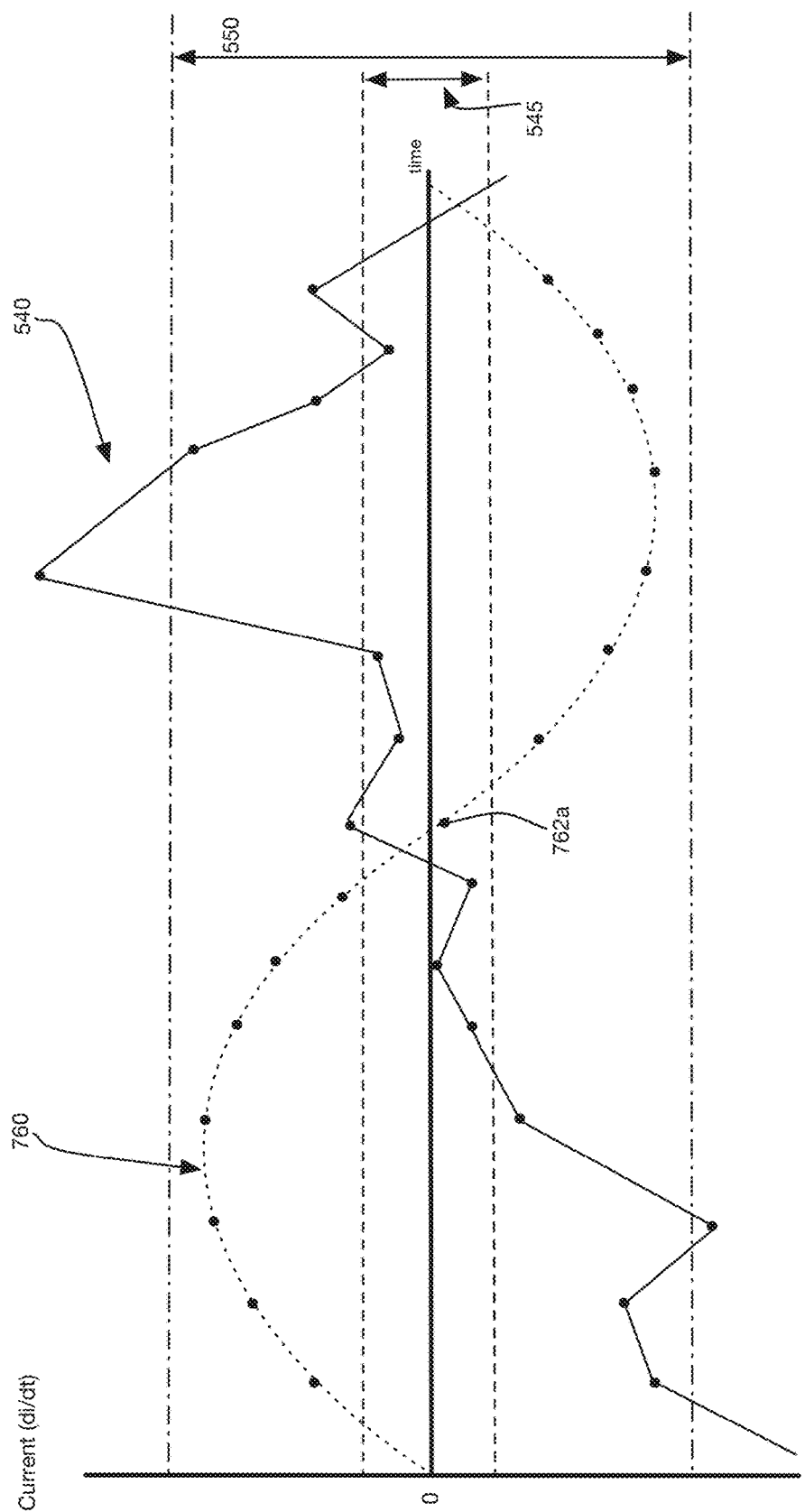

Additionally, and as discussed relative to FIGS. 6 and 7, the process 400 may be used to distinguish inrush currents from both low and high magnitude fault currents.

Referring to FIG. 6, a plot that includes an exemplary sampled low magnitude fault current 660 superimposed over the sampled differential signal 540 is shown. The sampled signal 660 (which results from a fault current) and the sampled differential signal 540 (which results from an inrush current) are superimposed in FIG. 6 for visualization. However, the fault current and the inrush current do not occur at the same time. But, a fault may occur upon transformer energizing and the inrush current may convert to the fault current.

The low magnitude fault current 660 includes samples 662 (662a, 662b, and 662c are labeled). If the root-mean-square (RMS) value of a sampled differential current exceeds the differential threshold, the protective relay 130 sends a signal to cause current to or from the transformer 105 to be blocked. The protective relay 130 operates due to the low magnitude fault current 660. Three of the samples, samples 662a, 662b, and 662c, are within the first range of values 545. Thus, the first range of values 545 is asserted. However, none of the samples 662 are outside of the second range of values 550 (the supervision range), and the second range of values 550 is not asserted. Consequently, the low magnitude fault current 660 is not determined to be an inrush current, and is instead identified as a fault current. In response to detecting the fault current 660, the protective relay 130 may operate, causing one or both of the circuit breakers 117a, 117b to open, blocking the flow of current to the transformer 105 and protecting the transformer 105 from the fault current 660.

Referring to FIG. 7, a plot that includes an exemplary sampled high magnitude fault current 760 superimposed on the sampled differential signal 540 is shown. The sampled fault current 760 (which results from a fault current) and the sampled differential signal 540 (which results from an inrush current) are superimposed in FIG. 7 for visualization purposes. However, the fault current and the inrush current do not occur at the same time.

The high magnitude fault current includes samples 762, with a sample 762a being labeled. If the RMS value of the differential current exceeds the differential threshold the protective relay 130 operates by, for example, sending a signal to one or both of the circuit breakers 117a, 117b or another interrupting element to cause current to or from the transformer 105 to be blocked. Operation of the relay 130 occurs because only one of the samples, sample 762a is within the first range of values 545, which is less than the pre-determined values of samples. Thus, the pre-determined number of sequential samples (three in this example) in the first range of values 545 is not present. As such, the high magnitude fault current 760 is not determined to be an inrush current, and is instead identified as a fault current.

Thus, the process 400 may be used to detect inrush currents and also distinguish inrush currents from both high and low magnitude fault currents.

Referring to FIG. 8, a plot of two cycles 841 and 843 of an exemplary sampled differential signal 840, which is derived from signals sensed by Rogowski coils while an inrush current flows through a conductor, is shown. The sampled differential signal 840 includes samples 842, only one of which is labeled for simplicity. An inrush current decays over time, causing the sampled differential signal 840 to decrease in magnitude over time. As a result, the first cycle 841 of the sampled differential signal 840 has a larger magnitude than the second cycle 843. Although only two cycles of the sampled differential signal 840 are shown, the sampled differential signal 840 may have more cycles. Cycles occurring after the second cycle 830 have a smaller magnitude than the magnitude of the second cycle 843. Cycles occurring before the first cycle 841 have a larger magnitude than the first cycle 841.

The example of FIG. 8 illustrates how the use of the first range of values 545 and the third range of values 555 may allow for detection of inrush currents throughout the duration of the inrush current. The first range of values 545 together with one or more samples outside of the supervision range 550 detects high magnitude inrush currents (an inrush current that is early in time). The third range of values 555 is asserted for low magnitude inrush currents (an inrush current that has decayed and is later in time). The overlap of the first range of values 545 and the third range of values 555 helps to ensure that inrush currents may be detected over their entire duration.

In the example of FIG. 8, an inrush current is detected when "N" pre-determined sequential samples of a cycle of the sampled differential signal 840 are in the first range of values 545 and at least one sample is outside of the supervision range 550, or when "M" pre-determined samples are in the third range of values 555. Values of N and M may be the same or different. In this example, "N" is three and "M" is four, however, other values may be used.

In the first cycle 841, a set 846 of three sequential samples is within the first range of values 545. Additionally, a sample 842a is outside of the supervision range 550. Based on both of these conditions being satisfied, an inrush current is detected.

In the second cycle 843, the magnitude of the differential signal has decreased. As a result, there are more than three samples that are within the first range of values 545. Additionally, there is now a set 848 of four sequential samples that are within the third range of values 555, and the third range of values 555 is, therefore, asserted. Even though there are no samples outside of the supervision range 550, an inrush current is detected because there are four samples within the third range of values 555.

FIG. 9 is an illustration of a plurality of cycles of a differential signal 940 obtained while an inrush current flowed. The signal 940 decays over time, with the highest magnitude of the inrush current occurring at the earliest point in time (t0). The time t0 corresponds to the time when the transformer 105 is energized. The third range of values 555 (FIG. 5) is not continuously asserted until a time t1, which may occur, for example several seconds after t0. In other words, from the time t0 until the time t1, a pre-determined number of sequential samples are not within the third range of values 555. Thus, using a test of whether the pre-determined number of sequential samples is within the third range of values 555 alone during this time period would misclassify an inrush current as a fault.

However, by using the first range of values 545, the supervision range 550, and the third range of values 555, the protective relay 130 accurately detects the presence of an inrush current. For example, operation of the protective relay 130 is blocked when the RMS value of the differential signal 540 exceeds the differential threshold and: (1) at least one sample of the differential signal 540 is outside of the supervision range 550 and a pre-determined number "N" sequential samples are inside the first range of values 545, or (2) when "M" sequential samples are detected within the third range of values 555.

Other features are within the scope of the claims. For example, the power transformer 105 is illustrated as a single-phase transformer. FIGS. 1 and 2 show a single line diagram of the transformer for the purposes of illustration. However, the transformer 105 may be a single-phase transformer, a two-phase power transformer, a three-phase power transformer, or any other multi-phase power transformer may be used in the protection system 100. A three-phase power transformer may include three primary coils and three secondary coils. In some implementations, three single-phase power transformers are mutually interconnected to provide three-phase power. In implementations that include a multi-phase power transformer, Rogowski coils may be included on any one, some, or all of the phases. A detection of inrush current on one phase may be used to prevent operation of a circuit breaker that controls the flow of current on the phase on which the inrush is detected and/or on another phase. A protective relay such as the protective relay 130 may be included on each phase, or a single protective relay may receive and generate signals for multiple phases.

Prior to comparing samples of an output signal from a Rogowski coil, the value of one or more of the samples may be adjusted to account for the transformer ratio.

Although the examples above discuss the pre-determined number of samples being three or four, other values may be used. For example, the pre-determined number of samples may be any number that is greater than two. In some implementations, the pre-determined number of samples in a single cycle of the differential signal may be based on a percentage of the total samples in the cycle of the differential signal.

The limits of the first range of values 545, the second range of values 550, and the third range of values 555 can be set as a percentage of the rated current of the power transformer being protected, with the center of the ranges 545, 550, 555 being at zero. The percentage of rated current may be, for example, at least 5-40%, and is different for each of the ranges 545, 550, 555.

What is claimed is:

1. A computer-implemented method for a power transformer, the method comprising:
    receiving a first signal corresponding to a primary current of a power transformer from a first Rogowski coil;
    receiving a second signal corresponding to a secondary current of the power transformer from a second Rogowski coil;
    sampling the first signal to produce samples of the first signal;
    sampling the second signal to produce samples of the second signal;
    comparing the samples of the first signal and the samples of the second signal to determine samples of a differential signal;
    determining that a pre-determined number of sequential samples of the differential signal are within a first range of values;
    determining that at least one sample of the differential signal is outside of a second range of values, the values of the first range of values being less than a maximum of the second range of values and greater than a minimum of the second range of values;
    determining that an inrush current is present based on the pre-determined number of sequential samples being within the first range of values and the at least one sample being outside of the second range of values; and
    blocking operation of a protective relay.

2. The computer-implemented method of claim 1, further comprising:
    determining whether a second pre-determined number of samples of the differential signal are within a third range of values, the third range of values being less than a maximum of the first range of values and greater than a minimum of the first range of values.

3. The computer-implemented method of 1, wherein determining that at least one sample of the differential signal is outside of the second range of values comprises:
    determining that at least one sample of the differential signal is greater than the maximum of the second range of values, and
    determining that at least one sample of the differential signal is less than the minimum of the second range of values.

4. A computer-implemented method of determining a presence of an inrush current on a current path in a power transformer, the method comprising:
    receiving a signal from a Rogowski coil positioned on a current path of a power transformer, the signal corresponding to a current flowing in the current path;
    sampling the received signal to produce samples of the received signal;
    analyzing the samples of the received signal relative to at least two criteria to determine whether an inrush current is present, wherein analyzing the samples of the received signal relative to at least two criteria comprises: determining whether a pre-determined number of sequential samples of the received signal are within a first range of values, and determining whether at least one sample of the received signal is outside of a second range of values, the values of the first range of values being less than a maximum of the second range of values and greater than a minimum of the second range of values;
    determining that an inrush current is present when the pre-determined number of sequential samples is within the first range of values, and at least one sample of the received signal is outside of the second range of values; and blocking operation of a protective relay based on determining that an inrush current is present.

5. The computer-implemented method of claim 4, wherein the power transformer comprises a plurality of single-phase power transformers mutually interconnected to provide multi-phase power.

6. A controller for a power transformer, the controller comprising:
one or more electronic processors and a non-transitory computer-readable medium, the non-transitory computer-readable medium comprising instructions that, when executed, cause the one or more electronic processors to:
receive a first signal from a first Rogowski coil, the first signal corresponding to a primary current of a power transformer;
receive a second signal from a second Rogowski coil, the second signal corresponding to a secondary current of the power transformer;
compare the first signal and the second signal to determine a differential signal;
sample the differential signal to produce samples of the differential signal;
determine that a pre-determined number of sequential samples of the differential signal are within a first range of values;
determine that at least one sample of the differential signal is outside of a second range of values, the values of the first range of values being less than a maximum of the second range of values and greater than a minimum of the second range of values;
determine that an inrush current is present based on the determination that the pre-determined number of sequential samples of the differential signal are within the first range of values and the determination that at least one sample of the differential signal is outside of the second range of values; and
block operation of a protective relay based on determining that an inrush current is present.

7. A system comprising:
a power transformer; and
a protection system comprising:
a first Rogowski coil positioned to sense a primary current of the power transformer and configured to produce a first signal corresponding to the primary current,
a second Rogowski coil positioned to sense a secondary current of the power transformer and configured to produce a second signal corresponding to the secondary current; and
a controller comprising one or more electronic processors and a non-transitory computer-readable medium, the non-transitory computer-readable medium comprising instructions that, when executed, cause the one or more electronic processors to:
sample the first signal to produce samples of the first signal,
sample the second signal to produce samples of the second signal,
determine samples of differential current based on the samples of the first signal and the second signal,
access a first range of values,
access a second range of values, the first range of values being within the second range of values,
determine whether a pre-determined number of sequential samples of the differential current are within the first range of values,
determine whether at least one of the samples is greater than a maximum value of the second range of values,
determine whether at least one of the samples is less than a minimum value of the second range of values; and
detect an inrush current when the pre-determined number of sequential samples is within the first range of values, at least one of the samples is greater than the maximum of the second range of values, and at least one of the samples is smaller than the minimum of the second range of values.

8. The system of claim 7, wherein the computer-readable medium further comprises instructions that, when executed, cause the processor to:
detect a fault current based on the pre-determined number of sequential samples of the differential signal being within the first range of values and no samples of the differential signal being outside of the second range of values.

9. The system of claim 7, wherein the computer-readable medium further comprises instructions that, when executed, cause the processor to:
detect a fault current based on fewer than the pre-determined number of sequential samples of the differential signal being within the first range of values; and
permit operation of a protective relay based on the detection of a fault current.

10. The system of claim 9, wherein permitting operation of a protective relay causes a current path to the power transformer to be blocked in response to detecting the fault current.

11. The system of claim 7, further comprising a circuit breaker on the current path.

12. A computer-implemented method comprising:
receiving a first signal corresponding to a primary current of a power transformer from a first Rogowski coil;
receiving a second signal corresponding to a secondary current of the power transformer from a second Rogowski coil;
sampling the first signal to produce samples of the first signal;
sampling the second signal to produce samples of the second signal;
comparing the samples of the first signal and the samples of the second signal to determine samples of a differential signal;
determining whether a first condition exists, wherein the first condition exists when a pre-determined number of sequential samples of the differential signal are within a first range of values, and at least one sample of the differential signal is outside of a second range of values, the values of the first range of values being less than a maximum of the second range of values and greater than a minimum of the second range of values;
determining whether a second condition exists, wherein the second condition exists when a second pre-determined number of sequential samples of the differential signal are within a third range of values, the third range of values being within the first range of values;
declaring an inrush current if at least one of the first condition and the second condition exists; and
blocking operation of a protective relay in response to declaring the inrush current.

13. The method of claim 12, wherein the pre-determined number of sequential samples and the second pre-determined number of sequential samples are the same.

14. The method of claim 12, wherein the pre-determined number of sequential samples and the second pre-determined number of sequential samples occur within a single cycle of the sampled differential signal.

* * * * *